United States Patent
Funabashi

(10) Patent No.: US 6,794,305 B2
(45) Date of Patent: Sep. 21, 2004

(54) METHOD OF MANUFACTURING A SEMICONDUCTOR INTEGRATED CIRCUIT DEVICE

(75) Inventor: Michimasa Funabashi, Hachioji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/902,672

(22) Filed: Jul. 12, 2001

(65) Prior Publication Data

US 2001/0039122 A1 Nov. 8, 2001

Related U.S. Application Data

(62) Division of application No. 09/392,568, filed on Sep. 9, 1999, now Pat. No. 6,277,749.

(30) Foreign Application Priority Data

Sep. 10, 1998 (JP) ............................................ 10-257267

(51) Int. Cl.[7] ............................................ H01L 21/302
(52) U.S. Cl. ........................ 438/745; 438/756; 134/1.3; 252/79.1
(58) Field of Search ............................... 438/745, 689, 438/704, 907, 908, 756; 134/1.3; 252/79.1, 79.5; 510/175

(56) References Cited

U.S. PATENT DOCUMENTS

| | | | |
|---|---|---|---|
| 4,239,661 A | 12/1980 | Muraoka et al. | ............ 438/471 |
| 4,958,061 A | 9/1990 | Wakabayashi et al. | ...... 219/411 |

(List continued on next page.)

FOREIGN PATENT DOCUMENTS

| JP | 3-53083 A | * | 3/1991 | ......... H01L/21/304 |
|---|---|---|---|---|
| JP | 03-109732 A | | 5/1991 | ......... H01L/21/304 |
| JP | 04-101418 A | | 4/1992 | ......... H01L/21/304 |
| JP | 6-41770 A | * | 2/1994 | ......... H01L/21/304 |
| JP | 07-153728 A | | 6/1995 | ......... H01L/21/304 |
| JP | 08-250461 A | | 9/1996 | ......... H01L/21/304 |
| JP | 08-306650 A | | 11/1996 | ......... H01L/21/304 |
| JP | 08-306651 A | | 11/1996 | ......... H01L/21/304 |
| JP | 09-286999 A | | 11/1997 | ......... H01L/21/304 |

OTHER PUBLICATIONS

Wolf, "Silicon Processing for the VLSI Era, vol. 1", 1986, pp. 198 and 201.*

Tsugane et al., "An advanced wet cleaning system for process integration", 1997 IEEE International Symposium on Semiconductor Manufacturing Conference Proceedings, Oct. 6–8, 1997, pp. B13–B16.*

Oimet et al., "Defect Reduction and Cost Savings through Re–Inventing RCA Cleans", *IEEE/SEMI Advanced Semiconductor Manufacturing Conference* (1996), pp. 308–313.

Watanabe et al., "Influence of particles/impurity metals in RCA cleaning solutions on surface contamination", *Internatinal Symposium on Semiconductor Manufacturing* (1994), pp. 99–102.

(List continued on next page.)

*Primary Examiner*—Matthew Smith
*Assistant Examiner*—Lex H. Malsawma
(74) *Attorney, Agent, or Firm*—Antonelli, Terry, Stout & Kraus, LLP

(57) ABSTRACT

A processing solution containing hydrogen peroxide, hydracid fluoride salt, and water is used for pre-cleaning prior to a step of forming a gate oxide film 14 by subjecting a silicon wafer 1 to a heat treatment. Tetraalkyl ammonium fluoride, ammonium fluoride or the like is used as hydracid fluoride salt.

10 Claims, 9 Drawing Sheets

U.S. PATENT DOCUMENTS

| | | | |
|---|---|---|---|
| 5,135,608 A | * 8/1992 | Okutani | 438/584 |
| 5,158,616 A | * 10/1992 | Kinosita et al. | 134/25.4 |
| 5,277,835 A | * 1/1994 | Ohmi et al. | 252/79.3 |
| 5,286,678 A | 2/1994 | Rastogi | 438/301 |
| 5,288,651 A | 2/1994 | Nakazawa | 438/145 |
| 5,290,361 A | 3/1994 | Hayashida et al. | 134/2 |
| 5,402,807 A | * 4/1995 | Moore et al. | 134/61 |
| 5,447,568 A | 9/1995 | Hayakawa et al. | 118/715 |
| 5,466,389 A | 11/1995 | Ilardi et al. | 510/175 |
| 5,525,535 A | * 6/1996 | Hong | 438/228 |
| 5,550,078 A | * 8/1996 | Sung | 438/210 |
| 5,679,171 A | * 10/1997 | Saga et al. | 134/3 |
| 5,716,535 A | * 2/1998 | Lee et al. | 216/99 |
| 5,780,406 A | * 7/1998 | Honda et al. | 510/175 |
| 5,783,495 A | 7/1998 | Li et al. | 438/738 |
| 5,855,811 A | 1/1999 | Grieger et al. | 252/79.3 |
| 5,858,106 A | * 1/1999 | Ohmi et al. | 134/1 |
| 5,858,863 A | * 1/1999 | Yokoyama et al. | 438/514 |
| 5,972,123 A | * 10/1999 | Verhaverbeke | 134/3 |
| 5,972,862 A | 10/1999 | Torii et al. | 510/175 |
| 5,990,060 A | * 11/1999 | Ohmi et al. | 510/175 |
| 6,030,932 A | * 2/2000 | Leon et al. | 510/175 |
| 6,068,788 A | * 5/2000 | Kezuka et al. | 252/79.1 |
| 6,087,243 A | * 7/2000 | Wang | 438/424 |
| 6,096,650 A | 8/2000 | Robinson et al. | 438/689 |

OTHER PUBLICATIONS

Osaka and Hattori, "Influence of Initial Wafer Cleanliness on Metal Removal Efficiency in Immersion SC–1 Cleaning: Limitation of Immersion–Type Wet Cleaning", *IEEE Trans. on Semiconductor Manufacturing*, vol. 11, No. 1 (Feb. 1998), pp. 20–24.

Ridley, Sr. et al., "Advanced Aqueous Wafer Cleaning in Power Semiconductor Device Manufacturing", *IEEE/SEMI Adv. Semiconductor Man. Conf.* (1998), pp. 235–242.

"Improved Organic Clean for Removing Contaminants on Semiconductor Wafer Surfaces", *IBM Tech. Dis. Bulletin*, Mar. 1985.

"Improvements to MOS Retention Time Based Tests", *IBM Tech. Dis. Bulletin*, May 1984.

* cited by examiner

METHOD OF MANUFACTURING A SEMICONDUCTOR INTEGRATED CIRCUIT DEVICE

This application is a Divisional application of prior application Ser. No. 09/392,568, filed Sep. 9, 1999 now U.S. Pat. No. 6,277,749.

BACKGROUND OF THE INVENTION

The present invention relates to a technique of manufacturing a semiconductor integrated circuit device, and particularly to a technique advantageously applied to cleaning process for a silicon wafer.

In the process of manufacturing a LSI using a wafer made of mono-crystalline silicon, a wafer cleaning technique (so-called RCA cleaning) proposed by RCA (a company name in the U.S.A.) has been widely used (ref. W. Kern et al., RCA Review, 31 (1970), p. 187).

The RCA cleaning is a cleaning technique based on a combination of (1) dipping process at 80° C. for about 10 to 20 minutes using a mixed solution (SC-1 solution or APM solution) of ammonia:hydrogen peroxide:water=1:1:5 (in volume ratio), (2) dipping process at a room temperature for several ten seconds using a mixed solution (DHF solution) of hydrofluoric acid:water=1:99, and (3) dipping process at 80° C. for about 10 minutes using a mixed solution (SC-2 solution or HPM solution) of hydrochloric acid:hydrogen peroxide:water=1:1:5. The SC-1 solution is used mainly to remove fine particles and organic contamination. The DHF solution is used mainly to remove a silicon oxide film, and the HPM solution is used mainly to remove metal contamination.

In recent years, proposals have been made of various cleaning techniques achieved by improving the RCA cleaning.

Japanese Patent Application Laid-Open No. 5-136119 discloses a technique in which phosphoric acid or phosphate is added to the APM solution thereby to restrict autolysis of hydrogen peroxide so that time-based changes such as an etching speed and the like are reduced.

Japanese Patent Application Laid-Open No. 61-60799 discloses a technique in which ammonium salt (for example, ammonium phosphate) is added to the APM solution thereby to restrict corrosion of Al (aluminum) wires.

Japanese Patent Application Laid-Open No. 6-216098 discloses a technique by which the contamination removal effect of the APM solution is raised and the RCA cleaning process is simplified. The technique is that cleaning is carried out with use of a mixed solution of the APM solution and complexone (such as EDTA or the like) of 0.1 to 100 ppm added thereto or a chelating agent obtained by substituting the ligand of the carboxylic acid radical of the complexone with another acid radical, and then rinsing is carried out using water added with hydrofluoric acid of 1 ppm or more.

Japanese Patent Application Laid-Open No. 6-41773 discloses a technique in which an anti-adsorption agent (such as NTPO, EDTPO, EDDPO, or the like) is added to an aqueous solution containing an alkaline component such as ammonium hydroxide, hydroxide of alkaline metal (KOH or NaOH), choline, or the like, thereby to restrict adsorption of metal into the wafer surface.

Japanese Patent Application Laid-Open No. 6-177101 discloses a technique in which a nonionic surface active agent (such as polyoxyethylene nonyl ether) is added to the APM solution thereby to form a foam layer on the solution surface so that scattering of ammonia is prevented.

Japanese Patent Application Laid-Open No. 7-245281 discloses a cleaning solution consisting of an alkaline oxidative aqueous solution which contains hydroxide of alkaline metal (KOH or NaOH) of 0.05 mol/l to 5 mol/l and hydrogen peroxide of 0.02 mol/l to 0.5 mol/l (and which may further contain a surface active agent such as alkyl benzene sulfate salt). In this cleaning solution, the pH of the solution is raised for adding the hydroxide of alkaline metal as a strong alkaline material, so that detergency with respect to strong contamination which are difficult to remove by normal RCA cleaning. Also, in this cleaning solution, the concentration of the hydroxide of alkaline metal and the concentration of the hydrogen peroxide are limited within such ranges that reaction proceeds uniformly at a relatively slow speed, and that unevenness of etching is not caused due to increase of the reaction speed.

In case of the APM solution used in the RCA cleaning, foreign materials are removed by etching a silicon oxide film by a hydroxyl group ($OH^-$). However, a silicon wafer is slightly etched by the hydroxyl group. In addition, in the APM solution, the hydroxyl group has a high concentration since ammonia has a high mixing ratio.

Therefore, in the cleaning process having used the APM solution, because being etched, the surface of the wafer is roughened and the flatness thereof is deteriorated. The deterioration of the flat surface affects adversely a boundary characteristics of the interface between the silicon wafer and a gate oxide film formed on the surface of the silicon wafer and causes deterioration of device characteristics such as reductions of the amount of the drive current and the mobility of electrons. This is a serious problem particularly for the process of forming a gate of a MOSFET which requires such a thin gate oxide film of high quality as to have a film thickness of several nm.

Also, the cleaning process using the APM solution requires processing at a high temperature (80° C.) for a long time (10 to 20 minutes) because the etching speed of the silicon oxide film based on a hydroxyl group is low. However, as a sheet-by-sheet processing in accordance with increase of the diameter of the wafer progresses, brief processing time of the cleaning process is required from the viewpoint of improving the throughput. Further, there is a problem that the operation cost for the cleaning device increases for performing the cleaning process at a high temperature.

SUMMARY OF THE INVENTION

An object of the present invention is to provide a cleaning technique capable of eliminating contamination by processing at a low temperature for a short time period without deteriorating the flatness of the wafer surface.

The above-described and other objects and novel features of the present invention will be clearly understood from the description of the present specification and the drawings attached hitherto.

Typical ones of the inventions disclosed in the present application will be briefly summarized as follows.

(1) The method of manufacturing a semiconductor integrated circuit device according to the present invention comprises a step of cleaning a surface of a silicon wafer with use of a processing solution containing hydrogen peroxide, hydracid fluoride salt, and water.

(2) The method of manufacturing a semiconductor integrated circuit device according to the present invention comprises a step of cleaning a surface of a silicon wafer with use of a processing solution containing ammonia, hydrogen peroxide, a strong alkaline component, and water.

According to the methods as described above, it is possible to achieve cleaning of a wafer surface with use of an etching seed which etches a silicon oxide film at a high speed but does not etch a silicon substrate. Therefore, contamination can be eliminated by processing at a low temperature in a short time without deteriorating the flatness of the wafer surface.

The other inventions than those described above will be summarized below, simply divided into aspects.

According to a first aspect of the present invention, there is provided a method of manufacturing a semiconductor integrated circuit, comprising a step of cleaning a surface of a silicon wafer with use of a processing solution containing hydrogen peroxide, hydracid fluoride salt, and water.

In the method according to the first aspect, the hydracid fluoride salt may be tetraalkyl ammonium fluoride.

In the method according to the first aspect, the hydracid fluoride salt may be ammonium fluoride.

In the method according to the first aspect, the processing solution may have a pH of 6 to 11.

In the method according to the first aspect, the processing solution may have a temperature of 40° C. or more.

In the method according to the first aspect, the surface of the silicon wafer may be cleaned in a sheet-by-sheet manner.

The method according to the first aspect may further comprise a step of cleaning the surface of the silicon wafer with use of a second processing solution containing hydrofluoric acid and water.

According to a second aspect of the present invention, there is provided a method of manufacturing a semiconductor integrated circuit device, comprising steps of (a) cleaning a surface of a silicon wafer with use of a processing solution containing hydrogen peroxide, hydracid fluoride salt, and wafer, (b) subjecting the silicon wafer to a heat treatment thereby to form a gate oxide film on the surface of the silicon wafer, and (c) patterning a conductive film deposited above the gate oxide film, thereby to form a gate electrode.

According to a third aspect of the present invention, there is provided a method of manufacturing a semiconductor integrated circuit device, comprising a step of cleaning a surface of a silicon wafer with use of a processing solution containing ammonia, hydrogen peroxide, a strong alkaline component, and water.

In the method according to the third aspect, the strong alkaline component may be tetraalkyl ammonium hydroxide.

In the method according to the third aspect, the processing solution may have a pH of 8 to 11.

According to a fourth aspect of the present invention, there is provided a method of manufacturing a semiconductor integrated circuit device, comprising steps of (a) cleaning a surface of a silicon wafer with use of a processing solution containing ammonia, hydrogen peroxide, a strong alkaline component, and water, (b)

subjecting the silicon wafer to a heat treatment thereby to form a gate oxide film on the surface of the silicon wafer, and (c) patterning a conductive film deposited above the gate oxide film, thereby to form a gate electrode.

According to a fifth aspect of the present inveniton, there is provided a method of manufacturing a semiconductor integrated circuit device, comprising a steps of cleaning a surface of a silicon wafer with use of a processing solution containing amine, hydrogen peroxide, a strong alkaline component, and water.

DESCRIPTION OF THE PREFERRED EMBODIMENTS

In the following, embodiments of the present invention will be specifically explained on the basis of the drawings. In all the figures for explaining the embodiments, those components that have an equal function are denoted at an equal reference symbol and reiterative explanation of those components will be omitted herefrom. In the embodiments below, explanation of same or similar portions will not be principally reiterated except for the case where such explanation is particularly necessary.

Also, in the embodiments below, if being required advantageously, explanation will be divided into a plurality of sections or other embodiments. However, those sections or other embodiments have any mutual relationship respectively except for a case where is clearly specified. Ones of those sections or other embodiments has any relationship with a part or all of the others, e.g., ones are modifications, detail, or complementary explanation of the others.

If any numeric expression is dealt with in the following embodiments (including the number of components, a numeric value, an amount, a range, and the like), the numeric expression does not suggest only one specific numeral but may suggest numerals equal to or greater or lower than the one specific numeral except for cases where any particular remark is provided and where the numeric expression is obviously principally limited to one specific numeral or numerals. Needless to say, any components or elements forming at least a part of the following embodiments (including steps of a method and the like) are not always essentially necessary except for cases where any particular remark is provided and the components or elements are considered as being obviously principally necessary.

Likewise, if any shape or positional relationship of the components or elements is dealt with below, the shape or positional relationship substantially includes an approximate or similar shape or relationship, except for cases where any particular remark is provided and where it is obviously understood that any approximate or similar shape or relationship is not included. The same applies to numerical values and ranges described above.

(Embodiment 1)

A method of manufacturing a CMOSFET (Complementary Metal Oxide Semiconductor Field Effect Transistor) in this embodiment will be described with reference to FIGS. 1 to 16.

Figure 1:
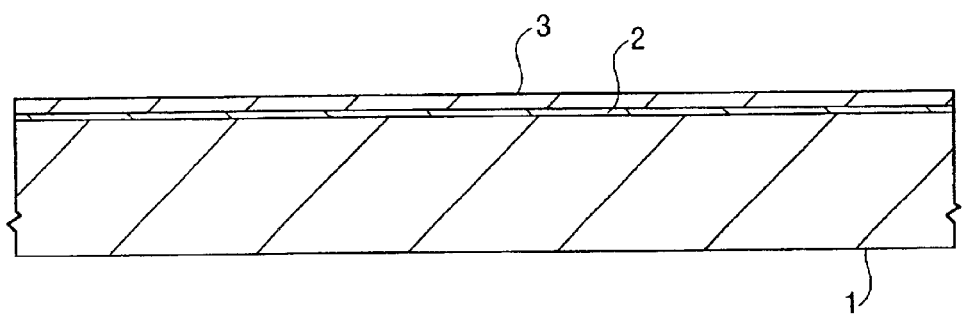
FIG. 1 is a cross-sectional view of a main part of a wafer, showing a method of manufacturing a CMOS-LSI as an embodiment 1 of the present invention.

Firstly, as shown in FIG. 1, a wafer 1 made of monocrystalline silicon having resistivity of about 10Ω is subjected to a heat treatment thereby forming a silicon oxide film 2 having a thickness of about 10 nm on its main surface. Thereafter, a silicon nitride film 3 having a film thickness of about 100 nm is deposited on this silicon oxide film 2 by a CVD method.

Figure 2:
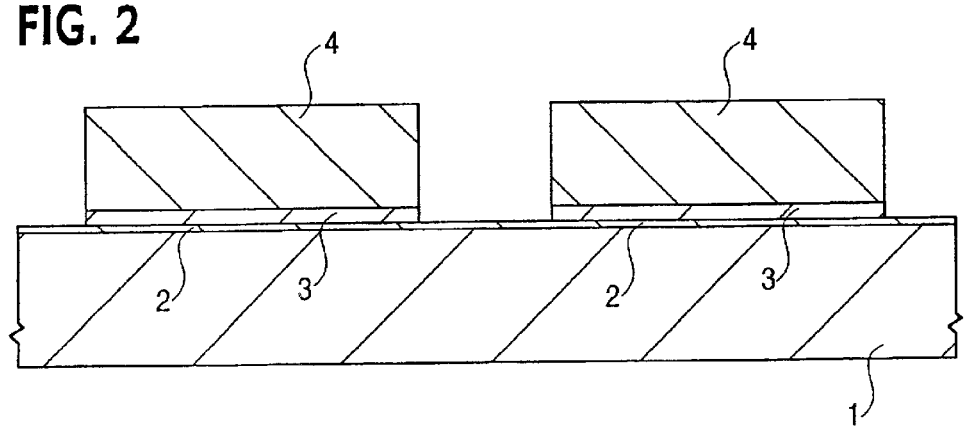
FIG. 2 is a cross-sectional view of a main part of a wafer, showing a method of manufacturing a CMOS-LSI as the embodiment 1 of the present invention.

Next, as shown in FIG. 2, a photoresist film 4 is formed partially on the silicon nitride film 3 so as to define an element separation region. The silicon nitride film 3 in the element separation region is dry-etched with the photoresist film 4 used as a mask.

Figure 3:
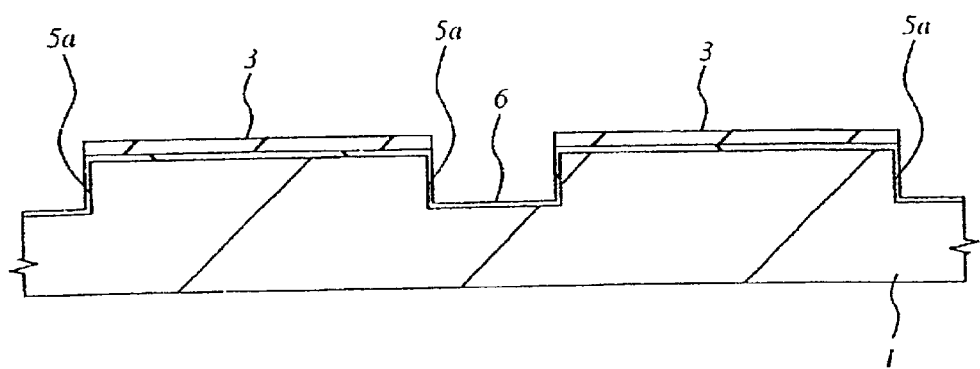
FIG. 3 is a cross-sectional view of a main part of a wafer, showing a method of manufacturing a CMOS-LSI as the embodiment 1 of the present invention.

Next, the photoresist film 4 is removed. Thereafter, as shown in FIG. 3, by using the silicon nitride film 3 as a mask, the silicon oxide film 2 and the wafer 1 are dry-etched sequentially such that a groove 5a having a depth of about 350 nm is formed in the wafer 1. Subsequently, a silicon oxide film 6 is formed on the inner wall of the groove 5a by a thermal oxidation treatment at 900 to 1,150° C.

Figure 4:
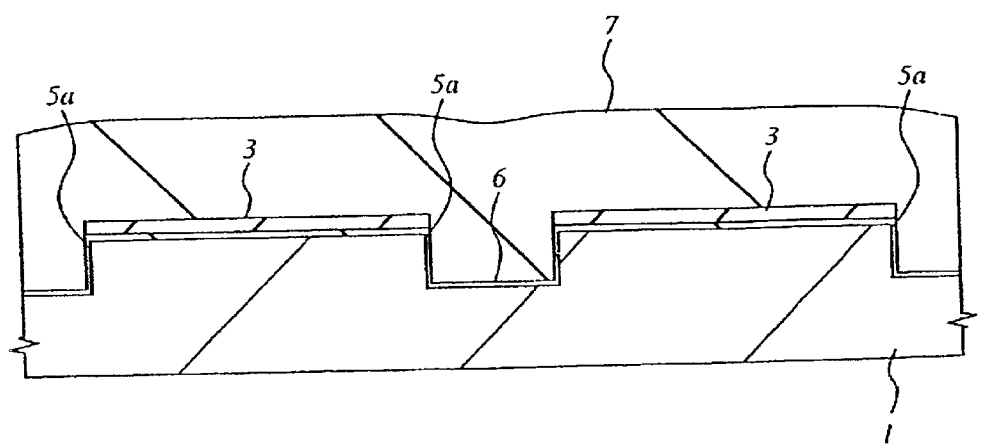
FIG. 4 is a cross-sectional view of a main part of a wafer, showing a method of manufacturing a CMOS-LSI as the embodiment 1 of the present invention.
Figure 5:
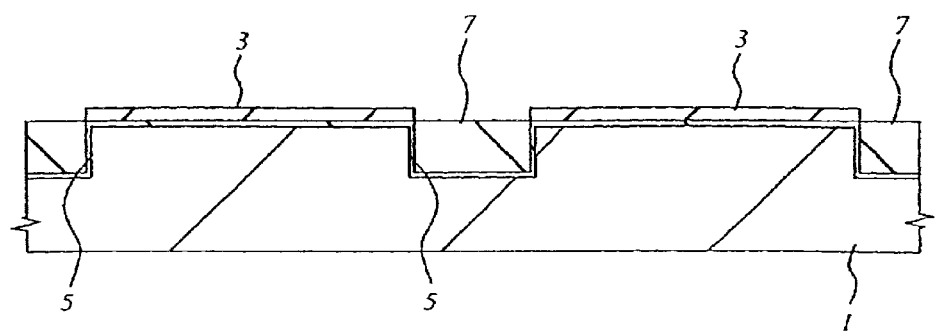
FIG. 5 is a cross-sectional view of a main part of a wafer, showing a method of manufacturing a CMOS-LSI as the embodiment 1 of the present invention.

Next, as shown in FIG. 4, a silicon oxide film 7 having a film thickness of about 800 nm is deposited, for example, by a CVD method using oxygen and tetraethoxysilane as a source gas. Thereafter, as shown in FIG. 5, the silicon oxide film 7 is polished by a Chemical Mechanical Polishing (CMP) method. As the silicon oxide film 7 remains only inside the groove 5a with using the silicon nitride film 3 as a polishing stopper, an element separation 5 is formed. Subsequently, a heat treatment at about 1000° C. is carried out to densify (sinter) the silicon oxide film 7 in the element separation groove 5.

Figure 6:
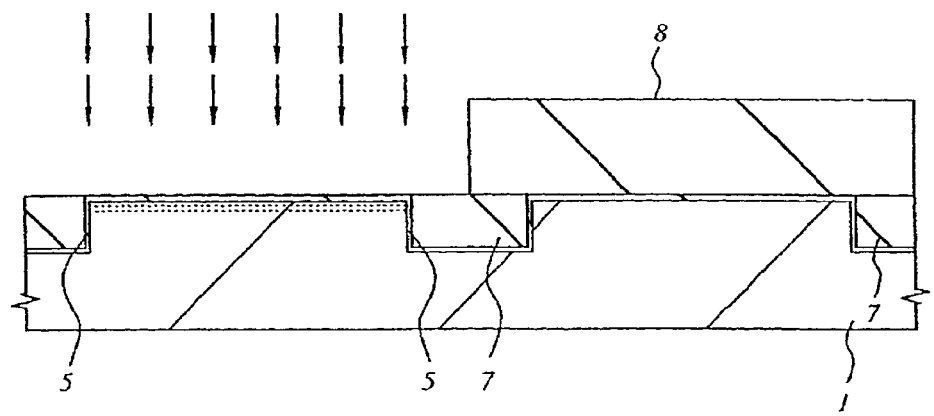
FIG. 6 is a cross-sectional view of a main part of a wafer, showing a method of manufacturing a CMOS-LSI as the embodiment 1 of the present invention.

Next, the silicon nitride film 3 is removed by wet etching with use of a thermo-phosphoric acid. Thereafter, as shown in FIG. 6, a photoresist film 8 is formed partially on the silicon oxide film 2 so as to define a formation region (the left portion in the figure) of a p-channel type MOSFET, and impurities are ion-implanted into the wafer 1 to form an n-type well, using the photoresist film 8 as a mask. Further, impurities for adjusting the threshold voltage of the p-channel type MOSFET are ion-implanted.

Figure 7:
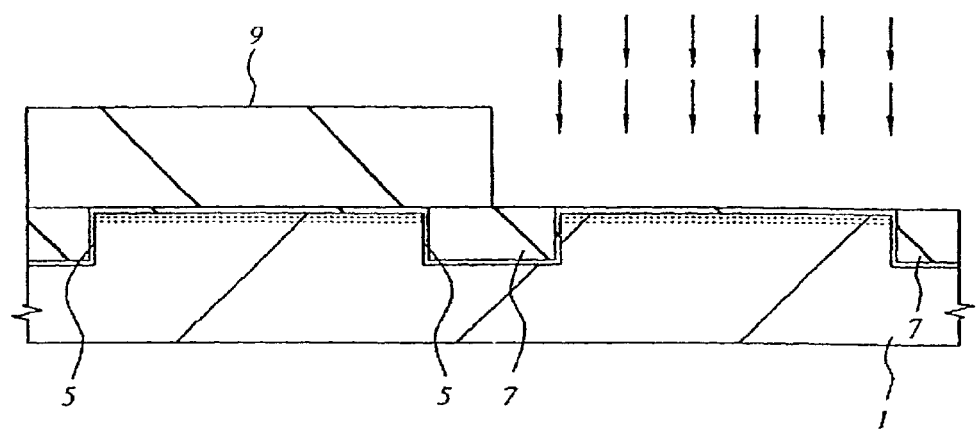
FIG. 7 is a cross-sectional view of a main part of a wafer, showing a method of manufacturing a CMOS-LSI as the embodiment 1 of the present invention.

Subsequently, the photoresist film 8 is removed. Thereafter, as shown in FIG. 7, a photoresist film 9 is formed partially on the silicon oxide film 2 so as to define a formation region of an n-channel type MOSFET, and impurities are ion-implanted into the wafer 1 to form a p-type well, using the photoresist film 9 as a mask. And further, impurities for adjusting the threshold voltage of the n-channel type MOSFET are ion-implanted.

Figure 8:
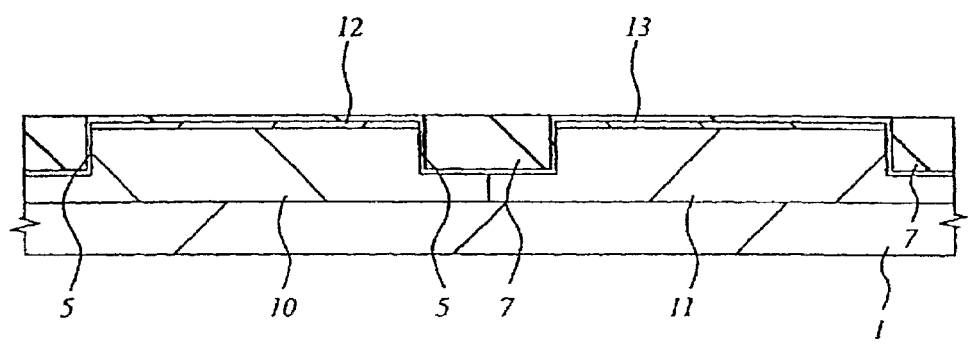
FIG. 8 is a cross-sectional view of a main part of a wafer, showing a method of manufacturing a CMOS-LSI as the embodiment 1 of the present invention.

Next, the photoresist film 9 is removed, the wafer 1 is subjected to a heat treatment at 950° C., for approximately one minute, thereby to spread and diffuse the above-mentioned n- and p-type impurities. In this manner, as shown in FIG. 8, a n-type well 10 is formed in the p-channel type MOSFET formation region in the wafer 1, and a p-type channel region 12 is formed near the surface thereof. At the same time, a p-type well 11 is formed in the n-channel type MOSFET formation region, and a n-type channel region 13 is formed near the surface thereof.

Next, after the surfaces of the above-mentioned n-type well 10 and p-type well 11 are cleaned by the following method, a gate oxide film is formed.

Figure 9:
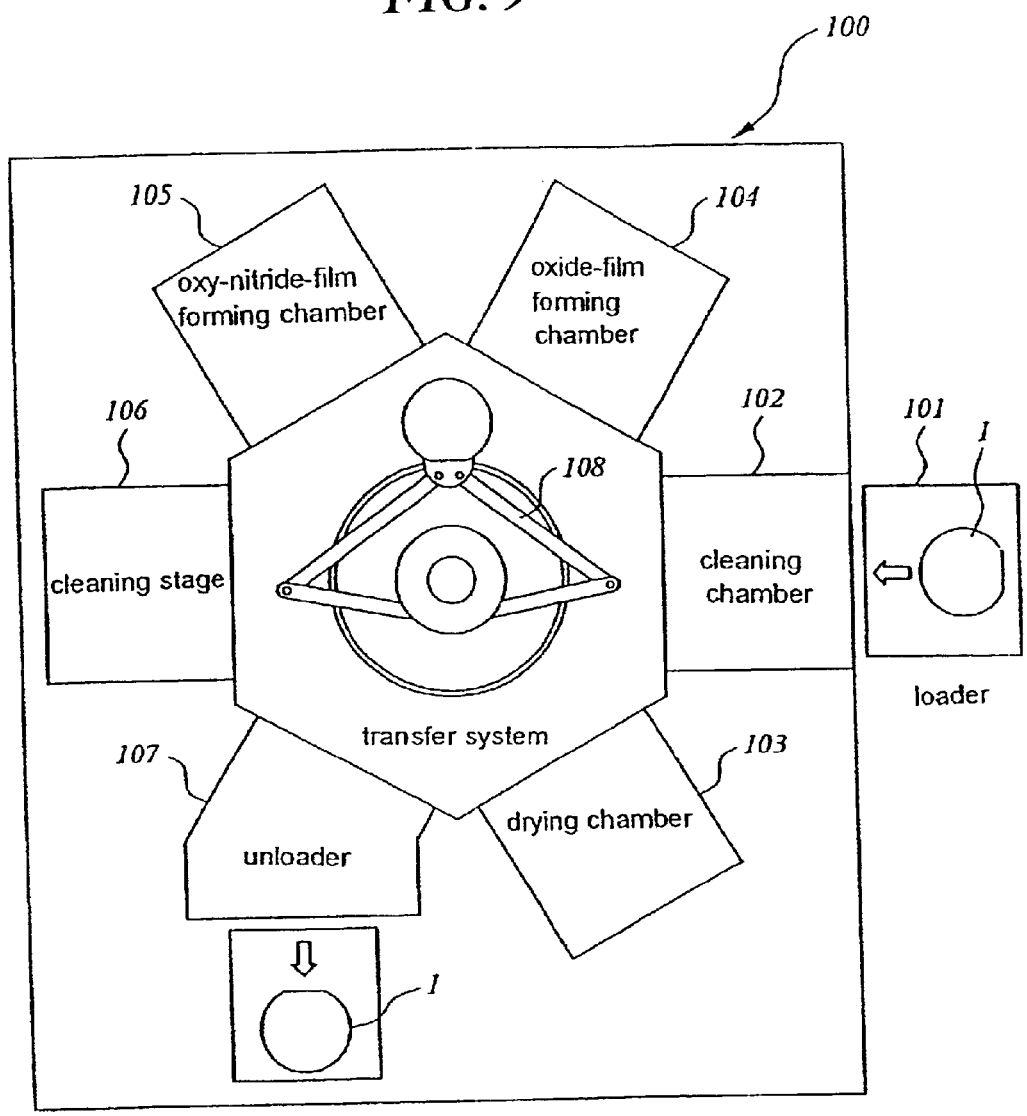
FIG. 9 is a schematic view showing a cleaning/oxide-film forming device used in the embodiment 1 of the present invention.

FIG. 9 is a schematic diagram which shows a sheet-by-sheet cleaning/oxide-film-forming device used in the present embodiment. The cleaning/oxide-film forming device 100 is constructed as a multi-chamber system comprising a cleaning chamber 102, a drying chamber 103, oxide-film forming chamber 104, oxy-nitride-film forming chamber 105, cooling stage 106, unloader 107, and the like. The transfer system in the center of the device comprises a robot hand 108 which carries the wafer 1 in from each of the processing chambers or out to each of the processing chambers. The inside of the transfer system is kept in an inactive gas atmosphere such as nitrogen or the like, to prevent, as much as possible, a natural oxide film from being formed on the surface of the wafer 1 due to air mixed into the atmosphere.

By adopting such a consistent system of pre-cleaning and oxidation, the wafer 1 can be transferred from the cleaning chamber 102 to the oxide-film forming chamber 104 in a short time period without contact with air. Therefore, it is possible to prevent foreign materials from sticking to the surface of the wafer 1 and a natural oxide film from being formed, as much as possible, while a gate oxide film is formed after pre-cleaning of the wafer 1.

The wafers 1 which have been loaded to the loader 101 of the cleaning/oxide-film-forming device 100 are transferred to the cleaning chamber 102, in units of every one or two sheet, and are dipped into a processing solution composed of a hydrogen peroxide, a hydracid salt fluoride and water. Here, the hydracid salt fluoride is, for example, tetraalkyl ammonium fluoride such as tetramethyl ammonium fluoride, tetraethyl ammonium fluoride, or ammonium fluoride.

The above processing solution which contains the hydracid salt fluoride generate fluorine ions (F-).

$$NH_4F \rightarrow NH_4^+ + F^- \quad \text{(Formula 1)}$$

Also, a part of the fluorine ions (F$^-$) generates a very small amount of hydracid fluoride by hydrolysis.

$$F^- + H_2O \rightarrow HF + OH^- \quad \text{(Formula 2)}$$

A part of the hydracid fluoride further reacts with fluorine ions (F$^-$) thereby generating hydracid fluoride ions (HF$^-$).

$$F^- + HF \rightarrow HF_2^- \quad \text{(Formula 3)}$$

Thus, in this processing solution, HF and HF$_2^-$ become etching seeds of the silicon oxide film. These etching seeds etch the silicon oxide film at a high speed but is characterized in that the silicon is not etched. Therefore, this processing solution can remove foreign materials at a lower temperature in a shorter time in comparison with an APM solution which removes foreign materials by etching the silicon oxide film with use of a hydroxyl group (OH$^-$). In addition, this processing solution enables processing at an ordinary temperature. Also, foreign materials can be removed by cleaning for several ten seconds by setting the processing temperature to 40° C. or more, or preferably to 50° C. Further, since this processing solution does not roughen the surface of wafer 1 unlike the APM solution, the surface of the wafer 1 can be kept flat after pre-cleaning at the atomic level.

The speed of etching the silicon oxide film by means of HF and $HF_2^-$ depends on the mol concentration of hydracid salt fluoride and the pH of the processing solution. A preferable concentration of hydrogen peroxide is 0.1 to 5%, and a preferable mol concentration of hydracid salt fluoride is 0.1 to 3 mol/l. Further, a preferable pH of the processing solution is 6 to 11.

When the wafer 1 is dipped into the above processing solution, the processing time may be further shortened by using ultrasonic vibration together. Also, a surfactant such as a chelating agent may be applied in order to prevent pollutants once removed from being stuck again.

Figure 10:
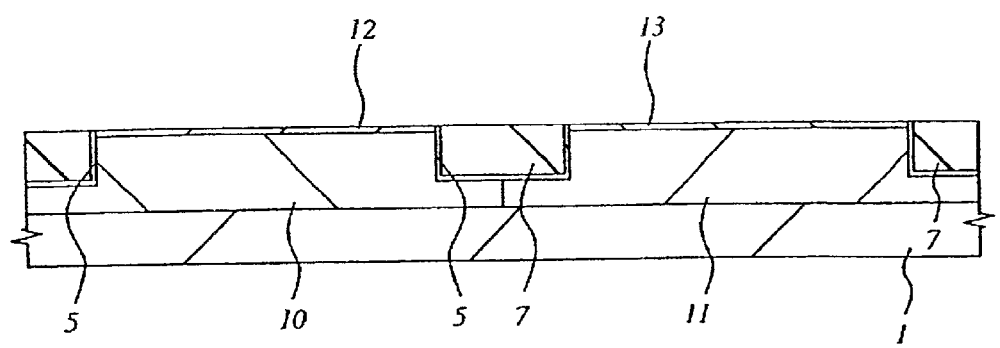
FIG. 10 is a cross-sectional view of a main part of a wafer, showing a method of manufacturing a CMOS-LSI as the embodiment 1 of the present invention.

Because the wafer 1 whose cleaning has been finished with the above processing solution is subjected to dipping process with use of a mixed solution (DHF solution) of hydrofluoric acid:water=1:99 for several ten seconds at the room temperature, the silicon oxide film on the surface thereof is removed thereby (FIG. 10).

Thereafter, the wafer 1 is transferred to the drying chamber 103 by the robot hand 108. Because the wafer 1 is subjected to drying processing such as spin-drying or IPA (Isopropyl alcohol) drying, moisture on the surface of the wafer 1 is thereby removed. The moisture remaining on the surface must sufficiently be removed because the moisture should cause a structural defect such as Si—H, Si—OH in the gate oxide film or on the gate-oxide-film/silicon interface and cause a charge trap.

Figure 11:
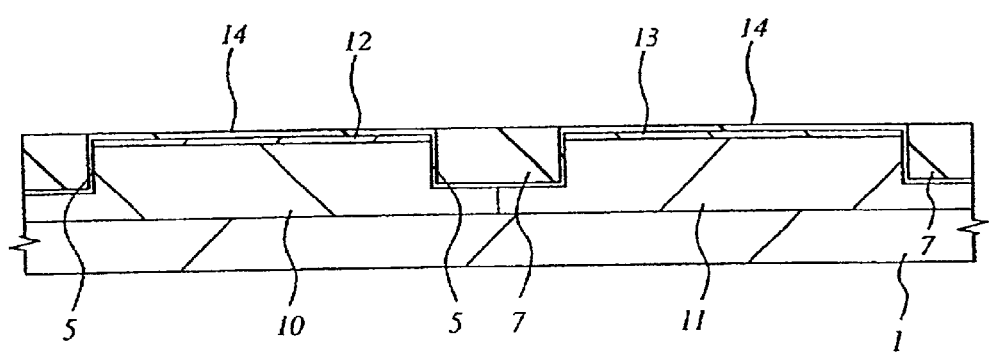
FIG. 11 is a cross-sectional view of a main part of a wafer, showing a method of manufacturing a CMOS-LSI as the embodiment 1 of the present invention.

The wafer 1 after drying processing is immediately transferred to the oxide-film-forming chamber 104 by the robot hand 108. The surface of the wafer 1 thus transferred to the oxide-film forming chamber 104 is oxidized in the mixed atmosphere of water and oxygen at about 800 to 900° C., so that a clean gate oxide film 14 having a film thickness of about 4 nm is formed on the surfaces of n-type well 10 and p-type well 11 (FIG. 11).

Next, the wafer 1 is transferred to an oxynitride-film forming chamber 105 and is heat-treated in an atmosphere of NO (nitrogen oxide) or $N_2O$ (dinitrogen monoxide), thereby to segregate nitrogen at the interface between the gate oxide film 14 and the wafer 1. When the gate oxide film 14 is thickened to about 5 nm, distortion appears clearly at the interface between the gate oxide film 14 and the wafer 1 and induces occurrence of hot carriers, due to the difference of the thermal expansion coefficient thereof with respect to that of the wafer 1. Since the nitrogen segregated at the interface between the gate oxide film 14 and the wafer 1 moderates this distortion, the above oxy-nitrifying processing can improve the reliability of the very thin gate oxide film 14.

Next, after the oxy-nitrifying processing is completed, the wafer 1 is cooled down to the room temperature on the cooling stage 106 and then is transferred to the outside through the unloader 107. The wafer 1 is further transferred to a CVD device (not shown) for depositing a conductive film for agate electrode. At this time, pollution of the gate oxide film 14 can be effectively prevented by connecting the CVD device in the rear stage of the cleaning/oxide-film forming device 100, and by performing the processing from the formation of a gate oxide film to the deposition of a conductive film for a gate electrode sequentially as batch-processing.

Figure 12:
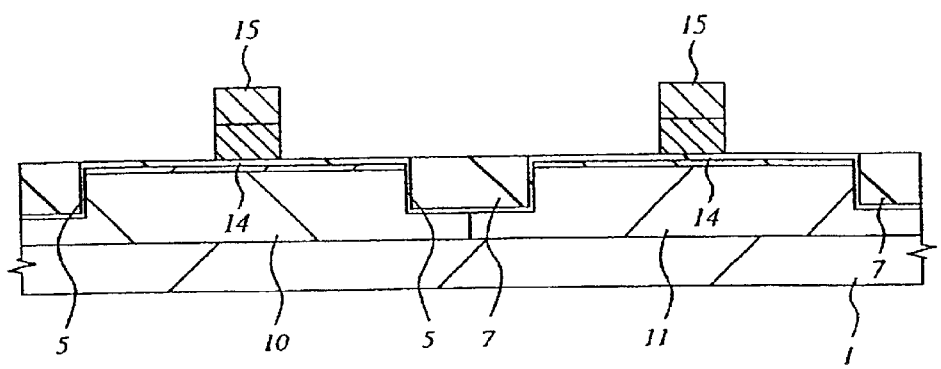
FIG. 12 is a cross-sectional view of a main part of a wafer, showing a method of manufacturing a CMOS-LSI as the embodiment 1 of the present invention.

Next, as shown in the FIG. 12, gate electrodes 15 are formed on the gate oxide film 14. After an n-type poly-crystalline silicon film having a film thickness of 150 nm and a non-doped poly-crystalline silicon film having film thickness of 150 nm on the wafer 1, for example, by a CVD method, are sequentially deposited, the gate electrodes 15 are formed by patterning these films and by dry-etching with a photoresist film used as a mask.

Figure 13:
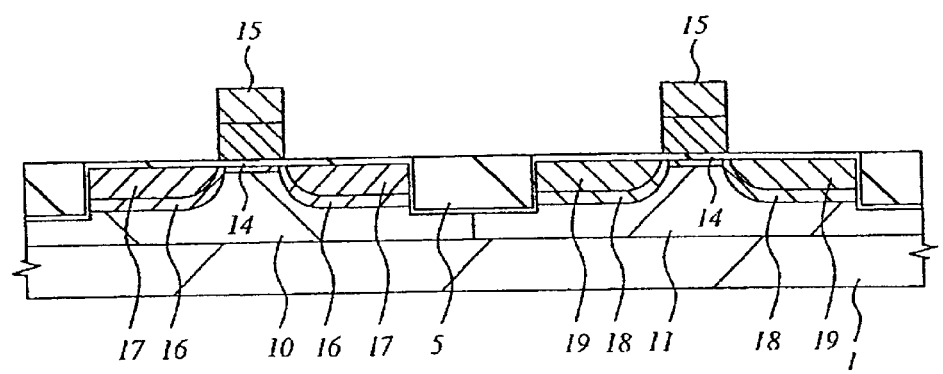
FIG. 13 is a cross-sectional view of a main part of a wafer, showing a method of manufacturing a CMOS-LSI as the embodiment 1 of the present invention.

Next, as shown in FIG. 13, p-type impurities such as B (boron) are ion-implanted into the formation region of the p-channel type MOSFET, in the vertical direction and an oblique direction, thereby to form $p^-$-type semiconductor regions 16 and p-type semiconductor regions 17 in the n-type well 10 in both sides of the gate electrode 15. Also, n-type impurities such as P (phosphorus) are ion-implanted in the vertical direction and an oblique direction, thereby to form $n^-$-type semi-conductor regions 18 and n-type semi-conductor regions 19 in the p-type well 11 in both sides of another gate electrode 15.

Figure 14:
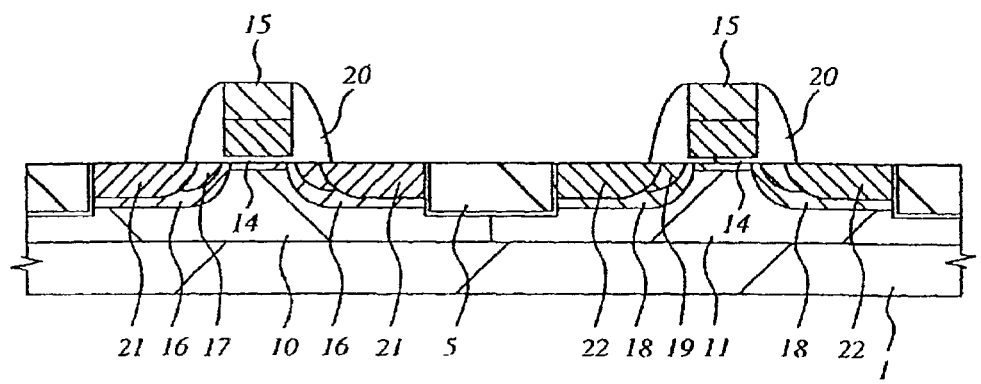
FIG. 14 is a cross-sectional view of a main part of a wafer, showing a method of manufacturing a CMOS-LSI as the embodiment 1 of the present invention.
Figure 15:
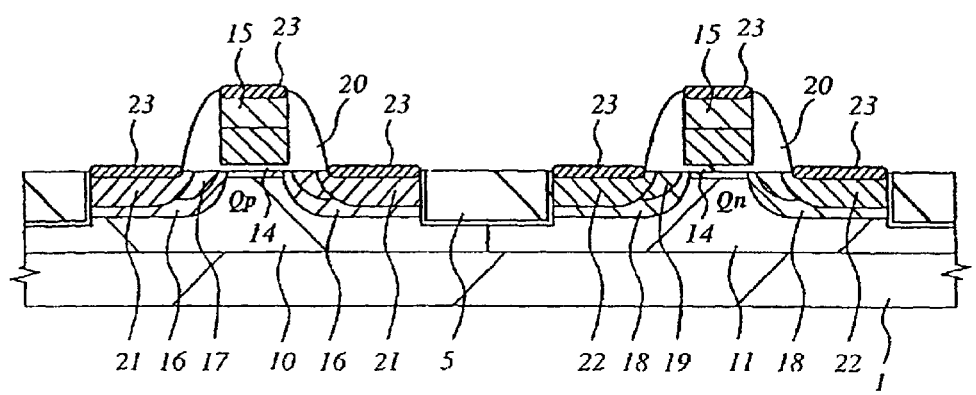
FIG. 15 is a cross-sectional view of a main part of a wafer, showing a method of manufacturing a CMOS-LSI as the embodiment 1 of the present invention.

Next, as shown in the FIG. 14, sidewall spacers 20 having a thickness of about 0.15 $\mu$m on a sidewall around the gate electrode 15 are formed by anisotropically etching an silicon oxide film which is deposited on the wafer 1 by a CVD method. At this time, the gate oxide film 14 above the p-type semi-conductor regions 17 and the gate oxide film 14 above the n-type semi-conductor regions 19 are removed. Subsequently, p-type impurities such as B (boron) are ion-implanted into the formation region of the p-channel type MOSFET, thereby to form $p^+$-type semiconductor regions 21 in the n-type well 10 in both sides of the gate electrode 15 Also, n-type impurities such as P (phosphorus) are ion-implanted into the formation region of the n-channel type MOSFET, thereby to form $n^+$-type semiconductor regions 22 in the p-type well 11 in both sides of another gate electrode 15.

Next, the surface of the wafer 1 is cleaned. Thereafter, as shown in the FIG. 15, a $TiSi_2$ (titanium silicide) layer 23 is formed on each of the surfaces of the gate electrode 15 of the p-channel type MOSFET, the $P^+$-type semiconductor regions 21 (source and drain regions), the gate electrode 15 of the n-channel type MOSFET, and the $n^+$-type semiconductor regions 22 (source and drain regions). The $TiSi_2$ layer 23 is formed in a manner in which a Ti film deposited on the wafer 1 by a sputtering method is heat-treated so as to react with the wafer 1 and the gate electrode 15 and which unreacted portions of the Ti film are removed by etching. Through this step, the p-channel type MOSFET (Qp) and the n-channel type MISFET (Qn) are completed.

Figure 16:
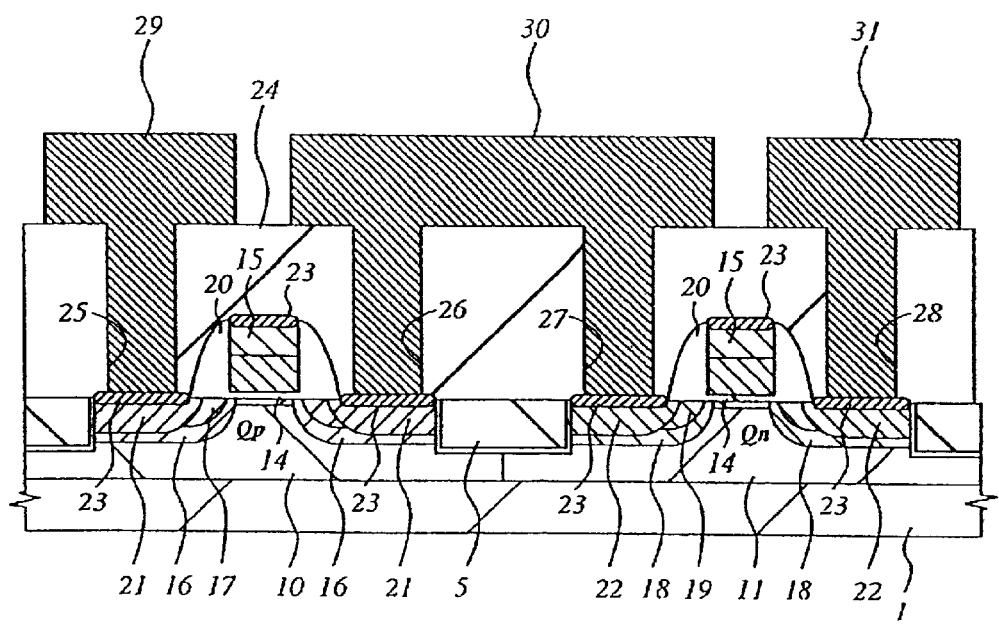
FIG. 16 is a cross-sectional view of a main part of a wafer, showing a method of manufacturing a CMOS-LSI as the embodiment 1 of the present invention.

Thereafter, as shown in FIG. 16, the contact holes 25 to 28 are formed in a silicon oxide film 24 deposited on the wafer 1 by a plasma CVD method and subsequently, a Al alloy film deposited on the silicon oxide film 24 by a sputtering method is subjected to patterning thereby to form wires 29 to 31. Thus, CMOS process according to the present embodiment is substantially completed.

As described above, according to the present embodiment, contamination can be eliminated by processing at a low temperature in a short time without deteriorating the flat surface of the wafer 1. In this manner, a very thin gate oxide film 14 having high quality can be formed, and it is therefore possible to restrict degradation of device characteristics, such as lowering of the amount of the drive current, lowering of the electron-transfer rate, and the like. In addition, since pre-cleaning of the wafer 1 can be performed at a low temperature in a short time, the throughput of cleaning processing can be improved. At the same time, the operation cost of the cleaning device can be reduced.

(Embodiment 2)

In the embodiment 1, the pre-cleaning is performed by using the processing solution composed of hydrogen peroxide, hydracid salt fluoride, and water. However, the wafer can be cleaned with a processing solution composed of ammonia, hydrogen peroxide, a strong alkaline component, and water.

The strong alkaline component is, for example, tetraalkyl ammonium hydroxide such as tetramethyl ammonium hydroxide, tetraethyl ammonium hydroxide, or the like. Amine may be used in stead of ammonium. The amine is, for example, primary amine such as monomethyl amine or monoethyl amine, secondary amine such as dimethyl amine or diethyl amine, or tertiary amine such as trimethyl amine or triethyl amine.

The above processing solution containing a strong alkaline component generates $HO_2^-$ ions via dissociation of the strong alkaline component. For example, in the case of using tetramethyl ammonium hydro-oxide (TMAH), most of all TMAH react with hydrogen peroxide in accordance with the following formula 4 and a great amount of $HO_2^-$ ions are generated.

$$(CH_3)_4NOH+H_2O_2 \rightarrow (CH_3)_4N^+ + HO_2^- + H_2O \qquad \text{(Formula 4)}$$

Thus, in this processing solution, $HO_2^-$ is an etching seed for the silicon oxide film. This etching seed has a characteristic that it etches the silicon oxide film at a high speed but does not etch silicon. Therefore, this processing solution can remove foreign materials at a low temperature in a short time in comparison with the APM solution which removes foreign materials by etching the silicon oxide film with a hydroxide group ($OH^-$). This processing solution accordingly enables processing at an ordinary temperature. If the processing temperature is set to 40° C. or more, preferably 50° C. or more, foreign materials can be removed by cleaning for several ten seconds.

Further, this processing solution can keep the surface of the wafer 1 flat at the atomic level after pre-cleaning, since this processing solution does not roughen the surface of the wafer 1 unlike the APM solution.

The speed of etching a silicon oxide film with use of $HO_2^-$ depends on the mol concentration of the strong alkaline component and on the pH of the processing solution. A preferable mol concentration of the strong alkaline component is 0.1 to 5 mol/l. Also, a preferable pH of the processing is 8 to 11.

As described above, according to the present embodiment, contamination can be eliminated by processing at a low temperature in a short time without deteriorating flatness of the surface of the wafer 1, like the above embodiment 1.

In the above, the invention made by the present inventor has been specifically explained, based on the embodiments of the invention. However, needless to say, the present invention is not limited to the above-mentioned embodiments but can be variously modified without deviating from the subject of the invention.

In the embodiments described above, explanation has been made of the case in which the embodiment is applied to pre-cleaning for gate formation process. However, it can also be applied to all process of cleaning the surface of a wafer, such as pre-cleaning prior to a step of forming $TiSi_2$ (titanium silicide) on surfaces of the source and drain of a MOSFET.

Also, in the embodiments described above, explanation has been made of the case of cleaning wafers in a sheet-by-sheet manner. However, the present invention can also be applied to the case of cleaning in a batch-processing manner.

Also, hydroxide of alkali metal such as sodium hydroxide (NaOH) or potassium hydroxide (KOH) is available as the strong alkaline component used for the processing solution in the above embodiment 2. In this case, although a countermeasure is required to prevent change of the device characteristic caused by alkaline metal ions, the manufacturing cost for the processing solution can be more reduced and disposal of the processing solution can be more facilitated, compared with the case of using tetraalkyl ammonium hydroxide.

Advantages obtained by typical ones of the inventions disclosed in the present application will be explained in brief below. The following are brief descriptions of the effectiveness which are generated by major portion of this invention.

According to the present invention, it is possible to eliminate contamination of the surface of a wafer by a cleaning processing at a low temperature in a short time without deteriorating the flatness of the wafer surface.

What is claimed is:

1. A method of manufacturing a semiconductor integrated circuit device, comprising the steps of:
    (a) providing a silicon wafer covered with an insulating film whose main surface is mainly formed of silicon oxide;
    (b) cleaning a surface of said silicon wafer covered with the insulating film whose main surface is mainly formed of silicon oxide, by a sheet-by-sheet manner at an ordinary temperature, with use of a processing solution which contains hydrogen peroxide, hydracid fluoride salt, and water, and also contains HF and $HF_2^-$ as the etching seeds of the silicon oxide, under conditions that said insulating film is etched but said silicon wafer is not etched, the concentration of said hydracid fluoride salt being in the range of about 0.1 to 3 mol/l;
    (c) removing said insulating film after said step (b), by applying a processing solution which contains hydracid fluoride and water, thereby to expose the surface of said silicon wafer;
    (d) drying said silicon wafer after said step (c); and
    (e) subjecting said silicon wafer to a heat treatment after said step (d), thereby to form a gate oxide film over said silicon wafer.

2. A method of manufacturing a semiconductor integrated circuit device according to claim 1, wherein the hydracid fluoride salt included in said processing solution is ammonium fluoride.

3. A method of manufacturing a semiconductor integrated circuit device according to claim 1, wherein the hydracid fluoride salt included in said processing solution is tetraalkyl ammonium fluoride.

4. A method of manufacturing a semiconductor integrated circuit device according to claim 1, wherein said processing solution further includes a surfactant.

5. A method of manufacturing a semiconductor integrated circuit device according to claim 1, wherein, during the step of cleaning the surface of said silicon wafer, said processing solution is ultrasonically vibrated.

6. A method of manufacturing a semiconductor integrated circuit device according to claim 1, wherein the heat treatment in said step (e) is performed after said step (d) without contacting said silicon wafer with the air.

7. A method of manufacturing a semiconductor integrated circuit device according to claim 1, wherein the processing solution has a temperature of 40° C. or less during the processing.

8. A method of manufacturing a semiconductor integrated circuit device according to claim 1, wherein said processing solution has a pH of 6 to 11.

9. A method of manufacturing a semiconductor integrated circuit device according to claim 1, wherein the heat treatment in said step (e) is performed in a mixed atmosphere which contains moisture and oxygen at a temperature of 800 to 900° C.

10. A method of manufacturing a semiconductor integrated circuit device according to claim 1, wherein said silicon wafer is transferred to a chamber immediately after said step (d) to perform the heat treatment in said step (e), thereby to form said gate oxide film.

* * * * *